United States Patent
Chang

(10) Patent No.: US 11,735,283 B2
(45) Date of Patent: Aug. 22, 2023

(54) SYSTEM AND METHOD OF TESTING MEMORY DEVICE AND NON-TRANSITORY COMPUTER READABLE MEDIUM

(71) Applicant: NANYA TECHNOLOGY CORPORATION, New Taipei (TW)

(72) Inventor: Po-Hsun Chang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 79 days.

(21) Appl. No.: 17/643,842

(22) Filed: Dec. 13, 2021

(65) Prior Publication Data

US 2023/0187006 A1    Jun. 15, 2023

(51) Int. Cl.
G11C 29/10 (2006.01)
G11C 29/50 (2006.01)

(52) U.S. Cl.
CPC ........ *G11C 29/10* (2013.01); *G11C 29/50012* (2013.01)

(58) Field of Classification Search
None
See application file for complete search history.

(56) References Cited

U.S. PATENT DOCUMENTS

| | | | |
|---|---|---|---|
| 6,574,626 B1* | 6/2003 | Regelman | G11C 29/56 711/2 |
| 10,372,573 B1* | 8/2019 | Kim | G06F 18/2413 |
| 2014/0047287 A1* | 2/2014 | Lee | G06F 13/4022 714/719 |
| 2015/0254390 A1* | 9/2015 | Douskey | G06F 30/30 716/52 |
| 2022/0317185 A1* | 10/2022 | Ru | G01R 31/31707 |

FOREIGN PATENT DOCUMENTS

JP    2008032653 A  *  2/2008
WO   WO-2012154279 A1 * 11/2012 ........... A61B 3/0041

* cited by examiner

*Primary Examiner* — Guerrier Merant
(74) *Attorney, Agent, or Firm* — CKC & Partners Co., LLC

(57) ABSTRACT

A method of testing a memory device includes steps as follows. Commands that meet a specification of the memory device are used. A random decision is performed on the plurality of commands to generate varied patterns, so that a testing device can test the memory device according to the varied patterns, where each of the varied patterns includes a sequence of one or more commands randomly selected from the plurality of commands.

14 Claims, 2 Drawing Sheets

SYSTEM AND METHOD OF TESTING MEMORY DEVICE AND NON-TRANSITORY COMPUTER READABLE MEDIUM

BACKGROUND

Field of Invention

The present invention relates to systems and methods, and more particularly, systems and methods of testing memory devices.

Description of Related Art

Dynamic random-access memory (DRAM) is a type of random-access semiconductor memory that stores each bit of data in a memory cell. Nowadays, people use patterns to analyze whether the DRAM is good enough or not. Basically, no matter what kind of tester, the pattern is hand made in the beginning. The pattern depends on the thought of people. The structure of the handmade pattern is usually simple, and thus, the handmade pattern is not enough to effectively and completely test the DRAM.

In view of the foregoing, there still exist some problems on the handmade pattern that await further improvement. However, those skilled in the art sought vainly for a solution. Accordingly, there is an urgent need in the related field to solve or circumvent above problems and disadvantages.

SUMMARY

The following presents a simplified summary of the disclosure in order to provide a basic understanding to the reader. This summary is not an extensive overview of the disclosure and it does not identify key/critical components of the present invention or delineate the scope of the present invention. Its sole purpose is to present some concepts disclosed herein in a simplified form as a prelude to the more detailed description that is presented later.

According to embodiments of the present disclosure, the present disclosure provides systems and methods of testing memory devices, to solve or circumvent aforesaid problems and disadvantages in the related art.

An embodiment of the present disclosure is related to a system of testing a memory device, and the system includes a storage device and a processor. The storage device is configured to store at least one instruction. The processor is electrically connected to the storage device and is configured to access and execute the at least one instruction for: using a plurality of commands that meet a specification of the memory device; performing a random decision on the plurality of commands to generate varied patterns, so that at least one testing device tests the memory device according to the varied patterns, wherein each of the varied patterns includes a sequence of one or more commands randomly selected from the plurality of commands.

Another embodiment of the present disclosure is related to a method of testing a memory device, and the method includes steps as follows. Commands that meet a specification of the memory device are used. A random decision is performed on the plurality of commands to generate varied patterns, so that a testing device can test the memory device according to the varied patterns, where each of the varied patterns includes a sequence of one or more commands randomly selected from the plurality of commands.

Yet another embodiment of the present disclosure is related to a non-transitory computer readable medium to store a plurality of instructions for commanding a computer to execute a method of testing a memory device, and the method includes steps as follows. Commands that meet a specification of the memory device are used. A random decision is performed on the plurality of commands to generate varied patterns, so that a testing device can test the memory device according to the varied patterns, where each of the varied patterns includes a sequence of one or more commands randomly selected from the plurality of commands.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
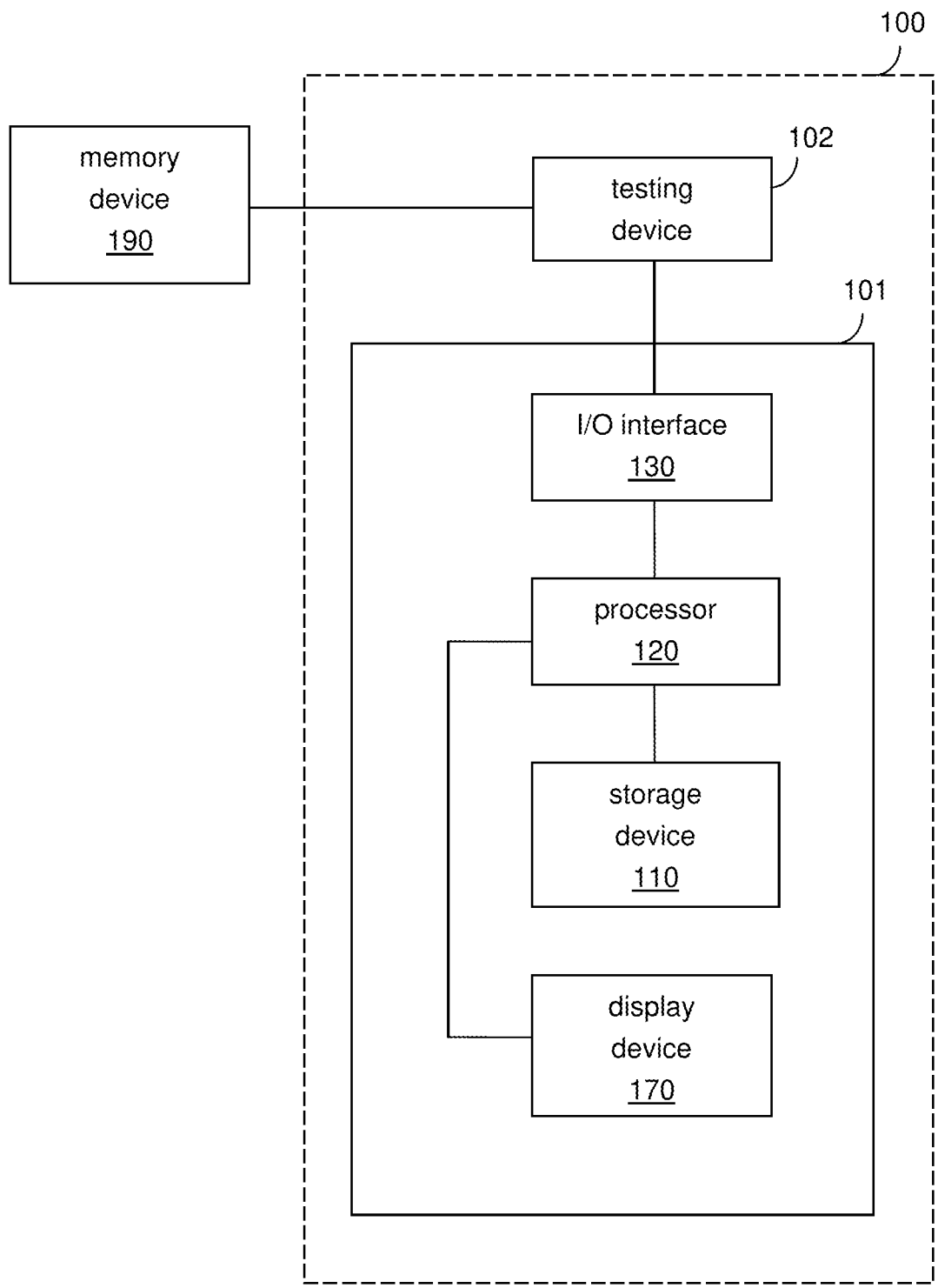
FIG. 1 is a block diagram of a system of testing a memory device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to FIG. 1. In one aspect, the present disclosure is directed to a system 100 of testing a memory device 190. This system may be easily integrated into a testing line and may be applicable or readily adaptable to all technologies. Herewith the system 100 of testing the memory device 190 is described below with FIG. 1.

The subject disclosure provides the system 100 of testing the memory device 190 in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a block diagram of the system 100 of testing the memory device 190 according to some embodiments of the present disclosure. As shown in FIG. 1, the system 100 includes a computer 101 and testing device 102. As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

In structure, for example, the computer 101 can be electrically connected to the testing device 102. It should be noted that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. For example, the testing device 102 may be a built-in testing device that is directly connected to the computer 101, or the testing device 102 may be an external testing device, and the computer 101 indirectly gets data of the testing device 102.

In practice, for example, the testing device 102 can be a testing circuit, a testing apparatus, test equipment (e.g., automatic test equipment, build-in test equipment and so forth), or the like.

In practice, for example, the computer 101 can be a computer host or a computer server. The computer server can be remotely managed in a manner that provides accessibility, consistency, and efficiency. Remote management removes the need for input/output interfaces in the servers. An administrator can manage a large data centers containing numerous rack servers using a variety of remote management tools, such as simple terminal connections, remote desktop applications, and software tools used to configure, monitor, and troubleshoot server hardware and software.

As shown in FIG. 1, the computer 101 includes a storage device 110, a processor 120, an input/output (I/O) interface 130 and a display device 170. In practice, for example, the storage device 110 may be storage hardware, such as a hard disk drive (HDD) or a solid-state drive (SSD), the processor 120 may be a central processing unit (CPU), the I/O interface 130 may include a connector, communication equipment, transmission equipment, an input device or the like and the display device 170 may be a LCD or the like.

In structure, the processor 120 is electrically connected to the storage device 110, the processor 120 is electrically connected to the I/O interface 130, and the processor 120 is electrically connected to the display device 170. The I/O interface 130 can be connected to the testing device 102. The testing device 102 is electrically connected to a memory device 190. In practice, for example, memory device 190 can be DRAM, flash memory or other memory circuits.

In use, the processor 120 accesses and executes the at least one instruction for using a plurality of commands that meet a specification of the memory device 190. Then, the processor 120 accesses and executes the at least one instruction for performing a random decision on the plurality of commands to generate varied patterns, so that the testing device 102 can test the memory device 190 according to the varied patterns. Each of the varied patterns includes a sequence of one or more commands randomly selected from the plurality of commands. In this way, the system 100 can automatically generate the varied patterns that are valid for the memory device 190, so as to effectively and completely test the memory device 190.

Then, the testing device 102 transmits the result of testing the memory device 190 to the computer 101, in which the I/O interface 130 receives the result of testing the memory device 190, the processor 120 stores the result of testing the memory device 190 in the storage device 110, and the display device 170 can display the content of the result of testing the memory device 190.

For a more complete understanding of the specification of the memory device 190, in some embodiment, the storage device 110 stores the specification comprising definitions of the plurality of commands, a plurality of timings and operation environment. In use, the processor 120 accesses and executes the at least one instruction for using the plurality of commands and the plurality of timings according to the specification of the memory device 190. Then, the processor 120 accesses and executes the at least one instruction for performing the random decision on the plurality of commands and the plurality of timings to establish the varied patterns. Each of the varied patterns includes the sequence of one or more commands randomly selected from the plurality of commands and one or more timings randomly selected from the plurality of timings. In this way, the system 100 can automatically generate the varied patterns in more various ways that are valid for the memory device 190, so as to more effectively and completely test the memory device 190.

In some embodiment, the processor 120 accesses and executes the at least one instruction for categorizing the varied patterns into a plurality of groups with different testing preferences. In practice, for example, the testing preferences may include a voltage testing preference, a current testing preference, a speed testing preference, a reliability testing preference, a access testing preference and so forth, but the present disclosure is not limited thereto.

For a more complete understanding of above categorization, in some embodiment, the processor 120 accesses and executes the at least one instruction for analyzing a respective testing preference of the each of the varied patterns based on characteristics of the one or more commands of the each of the varied patterns. Then, the processor 120 accesses and executes the at least one instruction for categorizing the varied patterns into the plurality of groups according to the respective testing preference of the each of the varied patterns, so that the plurality of groups can have the different testing preferences respectively.

In some embodiment, the processor 120 accesses and executes the at least one instruction for selecting one or more groups from the plurality of groups. Then, the processor 120 accesses and executes the at least one instruction for permutating and combining one or more patterns randomly selected from the one or more groups for generating at least one combined sequence, so that the testing device can test the memory device according to the at least one combined sequence. In practice, for example, when a special sequence is hard to generate by the above-mentioned random decision, the system 100 can perform the permutation and combination on the groups to generate the combined sequences that are more special and complex than above-mentioned varied patterns.

For an instance, the groups include a first group, a second group and a third group, in which the first group includes a first pattern, a second pattern and a third pattern, the second group includes a fourth pattern, a fifth pattern and a sixth pattern, and the third group includes a seventh pattern and an eighth pattern. For example, the processor 120 may randomly select the first and third groups from the first group, second and third groups, then the processor 120 may randomly select the first, second, third, seventh and eighth patterns from the first and third groups for performing the permutation and combination on the first, second, third, seventh and eighth patterns, so as to generate one or more combined sequences. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

In some embodiment, the storage device 110 stores a list recording the plurality of groups. In use, the processor 120 accesses and executes the at least one instruction for adding a new group in the list while the new group is generated. In this way, the system 100 can make an extension easily.

In some embodiment, the processor 120 accesses and executes the at least one instruction for performing the random decision anew according to a changed condition, so as to generate varied new patterns. In this way, the pattern maintenance of the system 100 is easier than the conventional handmade manner.

Figure 2:
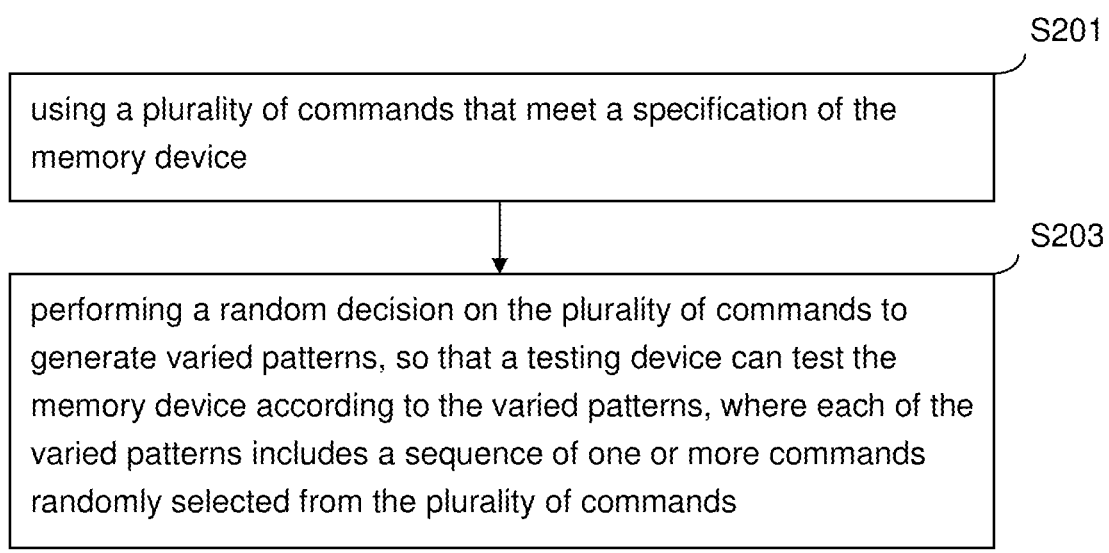
FIG. 2 is a flow chart of a method of testing the memory device according to some embodiments of the present disclosure.

For a more complete understanding of a method performed by the system 100, referring FIG. 1 and FIG. 2, FIG. 2 is a flow chart of the method 200 of testing the memory device 190 according to an embodiment of the present disclosure. As shown in FIG. 2, the method 200 includes operations S201 and S203. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The method 200 may take the form of a computer program product on a computer-readable storage medium having computer-readable instructions embodied in the medium. Any suitable storage medium may be used including non-memory device such as read only memory (ROM), programmable read only memory (PROM), erasable programmable read only memory (EPROM), and electrically erasable programmable read only memory (EEPROM) devices; memory device such as SRAM, DRAM, and DDR-RAM; optical storage devices such as CD-ROMs and DVD-ROMs; and magnetic storage devices such as hard disk drives and floppy disk drives.

In operation S201, commands that meet a specification of the memory device are used. In operation S203, a random decision is performed on the plurality of commands to generate varied patterns, so that the testing device 102 can test the memory device according to the varied patterns, where each of the varied patterns includes a sequence of one or more commands randomly selected from the plurality of commands. In this way, the method 200 can automatically generate the varied patterns that are valid for the memory device 190, so as to effectively and completely test the memory device 190.

For a more complete understanding of the specification of the memory device 190, in some embodiment, operation S201 includes steps of preloading the specification comprising definitions of the plurality of commands, a plurality of timings and operation environment; using the plurality of commands and the plurality of timings according to the specification of the memory device. Operation S203 includes steps of performing the random decision on the plurality of commands and the plurality of timings to establish the varied patterns, where the each of the varied patterns includes the sequence of one or more commands randomly selected from the plurality of commands and one or more timings randomly selected from the plurality of timings. In this way, the method 200 can automatically generate the varied patterns in more various ways that are valid for the memory device 190, so as to more effectively and completely test the memory device 190.

In some embodiment, in the method 200, the varied patterns are categorized into a plurality of groups with different testing preferences. In practice, for example, the testing preferences may include a voltage testing preference, a current testing preference, a speed testing preference, a reliability testing preference, a access testing preference and so forth, but the present disclosure is not limited thereto.

For a more complete understanding of above categorization, in some embodiment, a respective testing preference of the each of the varied patterns is analyzed based on characteristics of the one or more commands of the each of the varied patterns, and the varied patterns are categorized into the plurality of groups according to the respective testing preference of the each of the varied patterns, so that the plurality of groups can have the different testing preferences respectively.

In some embodiment, in the method 200, one or more groups are selected from the plurality of groups, and one or more patterns randomly selected from the one or more groups are permutated and combined for generating at least one combined sequence, so that the at least one testing device 102 can test the memory device 190 according to the at least one combined sequence. In practice, for example, when a special sequence is hard to generate by the above-mentioned random decision, the method 200 can perform the permutation and combination on the groups to generate the combined sequences that are more special and complex than above-mentioned varied patterns.

In some embodiment, in the method 200, a list recording the plurality of groups is stored, and a new group is added in the list while the new group is generated. In this way, the system 100 can make an extension easily.

In some embodiment, in the method 200, the random decision performed anew according to a changed condition, so as to generate varied new patterns. In this way, the pattern maintenance of the method 200 is easier than the conventional handmade manner.

In view of the above, according to the present disclosure, the system 100 and method 200 can automatically generate the varied patterns that are valid for the memory device 190, so as to effectively and completely test the memory device 190.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A system of testing a memory device, and the system comprising:
    a storage device configured to store at least one instruction; and
    a processor electrically connected to the storage device and configured to access and execute the at least one instruction for:
    using a plurality of commands that meet a specification of the memory device; and
    performing a random decision on the plurality of commands to generate varied patterns, categorizing the varied patterns into a plurality of groups with different testing preferences, selecting one or more groups from the plurality of groups, permutating and combining one or more patterns randomly selected from the one or more groups for generating at least one combined sequence, so that at least one testing device tests the memory device according to the varied patterns and the at least one combined sequence, wherein each of the varied patterns includes a sequence of commands randomly selected from the plurality of commands.

2. The system of claim 1, wherein the storage device stores the specification comprising definitions of the plurality of commands, a plurality of timings and operation environment, and the processor accesses and executes the at least one instruction for:

using the plurality of commands and the plurality of timings according to the specification of the memory device; and performing the random decision on the plurality of commands and the plurality of timings to establish the varied patterns, wherein each of the varied patterns includes the sequence of commands randomly selected from the plurality of commands and one or more timings randomly selected from the plurality of timings.

3. The system of claim 1, wherein the processor accesses and executes the at least one instruction for:

analyzing a respective testing preference of the each of the varied patterns based on characteristics of the commands of the each of the varied patterns; and categorizing the varied patterns into the plurality of groups according to the respective testing preference of the each of the varied patterns, so that the plurality of groups have the different testing preferences respectively.

4. The system of claim 1, wherein the storage device stores a list recording the plurality of groups, and the processor accesses and executes the at least one instruction for:

adding a new group in the list while the new group is generated.

5. The system of claim 1, wherein the processor accesses and executes the at least one instruction for:

performing the random decision anew according to a changed condition, so as to generate varied new patterns.

6. A method of testing a memory device, and the method comprising steps of:

using a plurality of commands that meet a specification of the memory device; and performing a random decision on the plurality of commands to generate varied patterns, categorizing the varied patterns into a plurality of groups with different testing preferences, selecting one or more groups from the plurality of groups, permutating and combining one or more patterns randomly selected from the one or more groups for generating at least one combined sequence, so that at least one testing device tests the memory device according to the varied patterns and the at least one combined sequence, wherein each of the varied patterns includes a sequence of commands randomly selected from the plurality of commands.

7. The method of claim 6, wherein the step of using the plurality of commands that meet a specification of the memory device comprises:

preloading the specification comprising definitions of the plurality of commands, a plurality of timings and operation environment; and using the plurality of commands and the plurality of timings according to the specification of the memory device, wherein the step of performing a random decision on the plurality of commands to generate the varied patterns comprises:

performing the random decision on the plurality of commands and the plurality of timings to establish the varied patterns, wherein each of the varied patterns includes the sequence of commands randomly selected from the plurality of commands and one or more timings randomly selected from the plurality of timings.

8. The method of claim 6, wherein the step of categorizing the varied patterns into the plurality of groups with the different testing preferences comprises:

analyzing a respective testing preference of the each of the varied patterns based on characteristics of the commands of the each of the varied patterns; and categorizing the varied patterns into the plurality of groups according to the respective testing preference of the each of the varied patterns, so that the plurality of groups have the different testing preferences respectively.

9. The method of claim 6, further comprising:
storing a list recording the plurality of groups; and
adding a new group in the list while the new group is generated.

10. The method of claim 6, further comprising:
performing the random decision anew according to a changed condition, so as to generate varied new patterns.

11. A non-transitory computer readable medium to store a plurality of instructions for commanding a computer to execute a method of testing a memory device, and the method comprising steps of:

using a plurality of commands that meet a specification of the memory device; and performing a random decision on the plurality of commands to generate varied patterns, categorizing the varied patterns into a plurality of groups with different testing preferences, selecting one or more groups from the plurality of groups, permutating and combining one or more patterns randomly selected from the one or more groups for generating at least one combined sequence, so that at least one testing device tests the memory device according to the varied patterns and the at least one combined sequence, wherein each of the varied patterns includes a sequence of commands randomly selected from the plurality of commands.

12. The non-transitory computer readable medium of claim 11, wherein the step of using the plurality of commands that meet a specification of the memory device comprises:

preloading the specification comprising definitions of the plurality of commands, a plurality of timings and operation environment; and using the plurality of commands and the plurality of timings according to the specification of the memory device, wherein the step of performing a random decision on the plurality of commands to generate the varied patterns comprises:

performing the random decision on the plurality of commands and the plurality of timings to establish the varied patterns, wherein each of the varied patterns includes the sequence of commands randomly selected from the plurality of commands and one or more timings randomly selected from the plurality of timings.

13. The non-transitory computer readable medium of claim 11, wherein the step of categorizing the varied patterns into the plurality of groups with the different testing preferences comprises:
- analyzing a respective testing preference of the each of the varied patterns based on characteristics of the commands of the each of the varied patterns; and
- categorizing the varied patterns into the plurality of groups according to the respective testing preference of the each of the varied patterns, so that the plurality of groups have the different testing preferences respectively.

14. The non-transitory computer readable medium of claim 11, wherein the method further comprises:
- storing a list recording the plurality of groups; and
- adding a new group in the list while the new group is generated.

\* \* \* \* \*